United States Patent
Ejima (10) Patent No.: US 6,420,980 B1
(45) Date of Patent: Jul. 16, 2002

(54) LOSSLESS COMPRESSION ENCODING METHOD AND DEVICE, AND LOSSLESS COMPRESSION DECODING METHOD AND DEVICE

(75) Inventor: Naoki Ejima, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/806,928

(22) PCT Filed: Oct. 6, 1999

(86) PCT No.: PCT/JP99/05507

§ 371 (c)(1),
(2), (4) Date: Apr. 6, 2001

(87) PCT Pub. No.: WO00/21199

PCT Pub. Date: Apr. 13, 2000

(30) Foreign Application Priority Data

Oct. 6, 1998 (JP) .......................................... 10-283687

(51) Int. Cl.[7] .............................................. H03M 7/40
(52) U.S. Cl. ............................. 341/65; 341/50; 341/59; 341/63; 341/67; 341/87
(58) Field of Search ............................. 341/50, 59, 67, 341/87, 63, 65

(56) References Cited

U.S. PATENT DOCUMENTS

| | | | | |
|---|---|---|---|---|
| 4,797,902 A | * | 1/1989 | Nishiguchi et al. | 375/27 |
| 5,084,904 A | * | 1/1992 | Daito | 375/27 |
| 5,303,374 A | * | 4/1994 | Mitsuhashi et al. | 395/2.21 |
| 6,023,233 A | * | 2/2000 | Craven et al. | 341/51 |
| 6,041,302 A | * | 3/2000 | Bruekers | 704/503 |

FOREIGN PATENT DOCUMENTS

| | | |
|---|---|---|
| EP | 0 427 884 | 5/1991 |
| JP | 61267456 | 11/1986 |
| JP | 05-308328 | 11/1993 |
| WO | 86/04198 | 7/1986 |
| WO | 97 29549 | 8/1997 |
| WO | 99 46885 | 9/1999 |

OTHER PUBLICATIONS

"Lossless compression of digital audio", Hans, M.; Schafer, R.W. IEEE Signal Processing Magazine, vol.: 18 Issue: 4, Jul. 2001; pp.:21–32.*
"Competitive Parallel Processing for Compression of Data", NTIS Tech Notes, U.S. Department of Commerce., May 1, 1990, pp. 379.
"Data Compression", ACM Computing Surveys, D.A. Lelewer et al., Sep. 1987, vol. 19, No. 3, pp. 291–296.
"Lossless Coding for Audio Discs", Journal of the Audio Engineering Society, Audio Engineering Society, Sep. 1, 1996, vol. 44, No. 9, pp. 706–720.

* cited by examiner

Primary Examiner—Michael Tokar
Assistant Examiner—Khai Nguyen
(74) Attorney, Agent, or Firm—Wenderoth, Lind & Ponack, L.L.P.

(57) ABSTRACT

A minimum difference from the predictive loop outputs for each block in a predetermined length of time to delete a run common to the blocks and subjects the shifted up data to the Huffman conversion. Thus, the source data of a 96 kHz/24 bits/6 ch format (13.824 MBps) can be compressed at a compression ratio of 0.7 so that the data rate is not greater than 9.6 Mbps determined by the DVD format. Similarly, mode of 192 kHz/24 bits/2 ch format and the like can be realized. A large amount of the linear PCM super-audio data are compressed can be recorded and reproduced in the DVD format, and the recording time is increased.

31 Claims, 8 Drawing Sheets

LOSSLESS COMPRESSION ENCODING METHOD AND DEVICE, AND LOSSLESS COMPRESSION DECODING METHOD AND DEVICE

TECHNICAL FIELD

The present invention relates to encoding and compression for transmitting and recording super-audio signals having a quality of reproduced sound much higher than that of compact disk.

BACKGROUND ART

There are a variety of techniques for compression of audio signals. Two major techniques are known. One of them is a lossless compression where redundant data which depend on self-correlation or relative-correlation of the data of music signals are extracted, and only the redundant components are compressed for transmission and recording. The other is perceptual encoding where dull components are allowed to be deleted based on the ambiguity of the human audible properties to perform a high efficiency of the encoding (or the quality is degraded). The latter is commonly used together with the former for low bit rate communication and package media. However, it is essential in the super-audio technology for targeting a much higher level of the sound quality than the compact disk (hereinafter referred to as CD) technology to employ the lossless compression which does not cause degradation of the quality. The following description is hence limited to the lossless compression.

One of such conventional techniques is disclosed in "Serial transmission apparatus with data compression function" in Japanese Patent laid-open Publication 7-74675 (1995). The object thereof is to improve the transmission rate in a serial transmission apparatus. An output of an analog-to digital converter which converts. input analog signal to digital signal is processed by a differential process, and the signals are compressed by the Huffman conversion. As the high-rate data is compressed and transmitted over a line having a given communication speed, the substantial transmission rate is increased, and this prior art is similar to the present invention on this point. The differential process functions to bias the profile of appearance probability of digital data, and this improves the compression efficiency in the Huffman conversion at the later stage. In other words, the differential circuit can increase its advantage by cooperating with the Huffman conversion circuit. For example, it is said that the compression rate for converting audio data directly by the Huffman compression is generally 90 to 95%, and similar data have been confirmed through a series of experiments by the inventors. When the Huffman compression is performed after the differential process, the rate may slightly be increased to 85 to 90%.

Meanwhile, as a variety of high-density recording media including DVD have been developed so far, the pulse code modulation (PCM) super-audio technology can be realized in a wider frequency range and in a wider dynamic range. The DVD audio technology is just on the stage of standardizing its format. Its draft version, Book 0.9, was explained in a meeting at Tokyo on Apr. 21, 1998. One of publications that introduces the meeting is "Radio Technology", June 1998, Vol. 52, No. 6, Serial No. 695, by IA Publishing, pp. 73–77. According to the report, the major parameters of the DVD audio technology include sampling frequencies of 48 kHz/96 kHz/192 kHz and 44.1 kHz/88.2 kHz/176.4 kHz, number of linear PCM quantization bits of 16/20/24, and maximum number of channels (ch) of 6. It is to be noted that the maximum bit rate is set to 9.6 Mbps. Any combination of the above parameters can be accepted as far as the bit rate is not greater than the determined level. For instance, a combination of 96 kHz, 24 bits, and 4 ch has bit rate of 9.216 Mbps, and it can be utilized. However, another combination of 96 kHz, 24 bits, and 5 ch has bit rate of 11.52 Mbpts which exceeds 9.6 Mbps, and it cannot be used. A further combination of 96 kHz, 24 bits, and 6 ch has bit rate of 13.824 Mbps exceeding 9.6 Mbps, and it cannot be used.

As to the movie, multi-channel systems becomes popular particularly in the United States of America. Some of home appliances employ multi-channel systems such as 5.1 channel (three channels at front center, left, and right, two channels at rear left and right, and one channel for a subwoofer), and others may follow before long. In view of such a background, a multi-channel system is also desired to employ the super-audio format. It is known that a combination of 96 kHz, 24 bits, and 6 ch is feasible with the use of high performance recording equipments available. It is then proposed to transmit and record DVD audio signals without degradation. Hence, the DVD audio technique is now demanded for the application of 96 kHz, 24 bits, and 6 ch.

In addition, besides the application of 96 kHz, 24 bits, and 6 ch to the DVD audio system, the recording time of 74 minutes on a single recording side is also desired, similarly to CD. This resides on the facts that most music workpieces are finished within 74 minutes and that master sources produced in the music industry are designated to fall in the length of 74 minutes. If its playback period stays within 74 minutes, both of the CD and DVD can favorably be planned, manufactured, and marketed. It is hence crucial for storage on a given size of disk medium that 4.7 GB (gigabytes) data in the DVD format are compressed so that its bit rate calculated by dividing 4.7 GB with the playback period (74 minutes) is not higher than 8.47 Mbps.

The foregoing requirements are now compiles below.

(a) The data compression shall be conducted by lossless compression which permits reversible conversion.

(b) The transmission rate shall be not higher than 9.6 Mbps defined as the maximum level in the DVD audio format.

(c) The average transmission rate shall be not higher than 8.47 Mbps for not exceeding the playback time of 74 minutes.

(d) Preferably, the data shall be compressed to 60% or less for allowing the playback time of 74 minutes at the mode of 96 kHz, 24 bits, and 6 ch.

DISCLOSURE OF INVENTION

The invention is developed to achieve the above requirements, and its object is to provide a method and an apparatus for carrying outlossless compression encoding and decoding of data (a) in a perfectly reversible mode, (b) at a peak transmission rate of not higher than 9.6 Mbps, (c) at average transmission rate of not higher than 8.47 Mbps or playback time of 74 minutes, and (d) at compression ate of 60% or less when playback time of 74 minutes is attained in the format of 96 kHz, 24 bits, and 6 ch.

In a method and in an apparatus for lossless compression encoding according to the invention, a given number of input data samples in a predetermined length of time is grouped to blocks, correlation between the samples in each block is deleted, redundant run lengths are determined in the data after subjected to the correlation deletion, and minimum of the redundant run length or run length of a common redundant portion in the samples is detected. Then, the common redundant portion is deleted from each sample, the data which have been subjected to the deleting the common redundant portion are subjected to the Huffman conversion, and the run length data of the common redundant portion and the Huffman-converted data for each sample are provided.

In a method and in a apparatus for lossless compression decoding according to the invention, code data are received which comprises run length data of a common redundant portion and data subjected to Huffman conversion in each sample, the data having been obtained by the steps of grouping a given number of input data samples in a predetermined length of time to blocks, deleting correlation between the samples in each block, determining redundant run length or run length of a common redundant portion in the samples after the correlation deletion, and deleting the redundant run length from each sample. Then, a conversion algorithm is get from the input data, and it is used for the Huffman decoding, and the run length data of the common redundant portion is gotten and added to the decoded data after the Huffman decoding. Then, correlation decoding is performed on the data to which the redundant portion is added.

Thus, in the method and the apparatus for lossless compression encoding, the redundant portion is deleted by using correlation in the input signals, and the signals are further compressed efficiently; with use of bias in the data profile. Thus, the data is reduced to a size substantially equal to the entropy of the input signals. Further, in the method and the apparatus for lossless decoding, the compressed data are decoded in the reverse sequence. Thus, the input signals of audio signals of a wide-band multi-channel format can be reproduced completely without degradation. As a result, the method and apparatus for lossless compression encoding or decoding can be provided where complete lossless compression is realized and the amount of data to be transmitted can be reduced to 60% or less.

In the method and the apparatus of lossless compression encoding, in the deletion of correlation, a difference, or a predictive difference, between the data predicted by a predictor or a predictive filter and the real data is taken out. For example, the predictor or the predictive filter comprises a circuit for integer calculation having accuracy equal to a range of integers of the input data.

Further, in the method and the apparatus of lossless compression encoding, in the Huffman conversion, the data after deleting the common redundant portion are separated to an upper part having a predetermined number of bits and a lower part of the other bits, and only the upper part is subjected to the Huffman conversion. In the method and the apparatus of lossless compression decoding, in the Huffman decoding, the input data are separated to an upper part in correspondence to a given pattern of the Huffman conversion and a lower part having a predetermined number of bits determined by the data transmitted as a parameter for each block, and only the upper part is subjected to the Huffman decoding.

The apparatus of lossless compression encoding comprises a plurality of sets of the above-mentioned correlation deleter, common redundant bits deleter and Huffman conversion device. Further a maximum efficiency data output device is provided to select and output data which provide maximum efficiency from the output data of the plurality of the Huffman conversion devices. It outputs a combination of the data which provides the maximum efficiency and transmits a parameter indicative of the combination.

In the method and the apparatus of lossless compression and encoding or decoding, the most advantageous is selected among a plurality of correlation deletion characteristics.

In the apparatus of lossless compression encoding, a plurality of correlation deleters are provided to delete correlation. Output data of each of the correlation deleters are subjected to the deletion of the common redundant portion, and each data after the deletion of the common redundant portion is subjected to the Huffman conversion. Then, a combination having the maximum efficiency is selected among the data subjected to the Huffman conversion, and a parameter indicative of the combination is transmitted.

In the method and the apparatus of lossless compression encoding, the Huffman conversion is performed by selecting and using one of conversion algorithms which provides the maximum efficiency for the block, and a parameter indicative of the algorithm is transmitted.

In the method and apparatus of lossless compression data decoding, in the correlation decoding, a sum of a predictive data generated by the local predictor or the local predictive filter and the transmitted input data is taken out. The local predictor or the local predictive filter comprises, for example, a circuit for integer calculation operated at accuracy equal to that of a range of integers of playback data.

In the method and the apparatus for lossless compression decoding, in the Huffman decoding, a signal is selected having a property determined by the data transmitted for each block.

The apparatus for lossless compression decoding further comprises an associate data detector which detects an associate data associated with the received coded data. The Huffman decoder includes a plurality of Huffman tables, and the associate data detector selects one of the Huffman tables corresponding to the associate data.

In the method and the apparatus for lossless compression decoding, sample data positioned at a particular position in the top of each block are linear pulse code modulation data. Thus, the speed to return from error propagation can be increased, and reproduced sound of special mode of cue/review can be heard with ease.

A recording apparatus may comprise the above-mentioned lossless compression encoding apparatus and a DVD formatter which converts the signals received from the lossless compression encoding apparatus to DVD format signals, and the like.

A playback apparatus may comprise the above-mentioned lossless compression decoder, a DVD de-formatter which converts the signals to code data, and the like.

An advantage of the method and apparatus for lossless compression encoding and decoding according to the present invention is that a large volume of data can be compressed without degradation thus for recording and play-backing more information throughout a longer time.

BEST MODE FOR CARRYING OUT THE INVENTION

Embodiments of methods and apparatuses for lossless compression encoding or decoding of data according to the invention will be described with reference to the appended drawings.

A lossless compression encoding apparatus according to the invention detects and normalizes correlation of input signals with its correlation deleter, deletes redundant portions in the signals with a common redundant bits (CRB) deleter, and compresses the remaining signals through conversion with use of bias of the data distribution of its Huffman compressor. A lossless compression decoding apparatus according to the invention decodes the compressed data in reverse sequence by a Huffman decoder, a CRB decoder (a common redundant bits adder), and a correlation decoder. As a result, the audio signals of wideband multi-channel mode can be transmitted, received and outputted without degradation. This allows the input signals to be compressed to a size substantially equal to the entropy of the signals.

Figure 1:
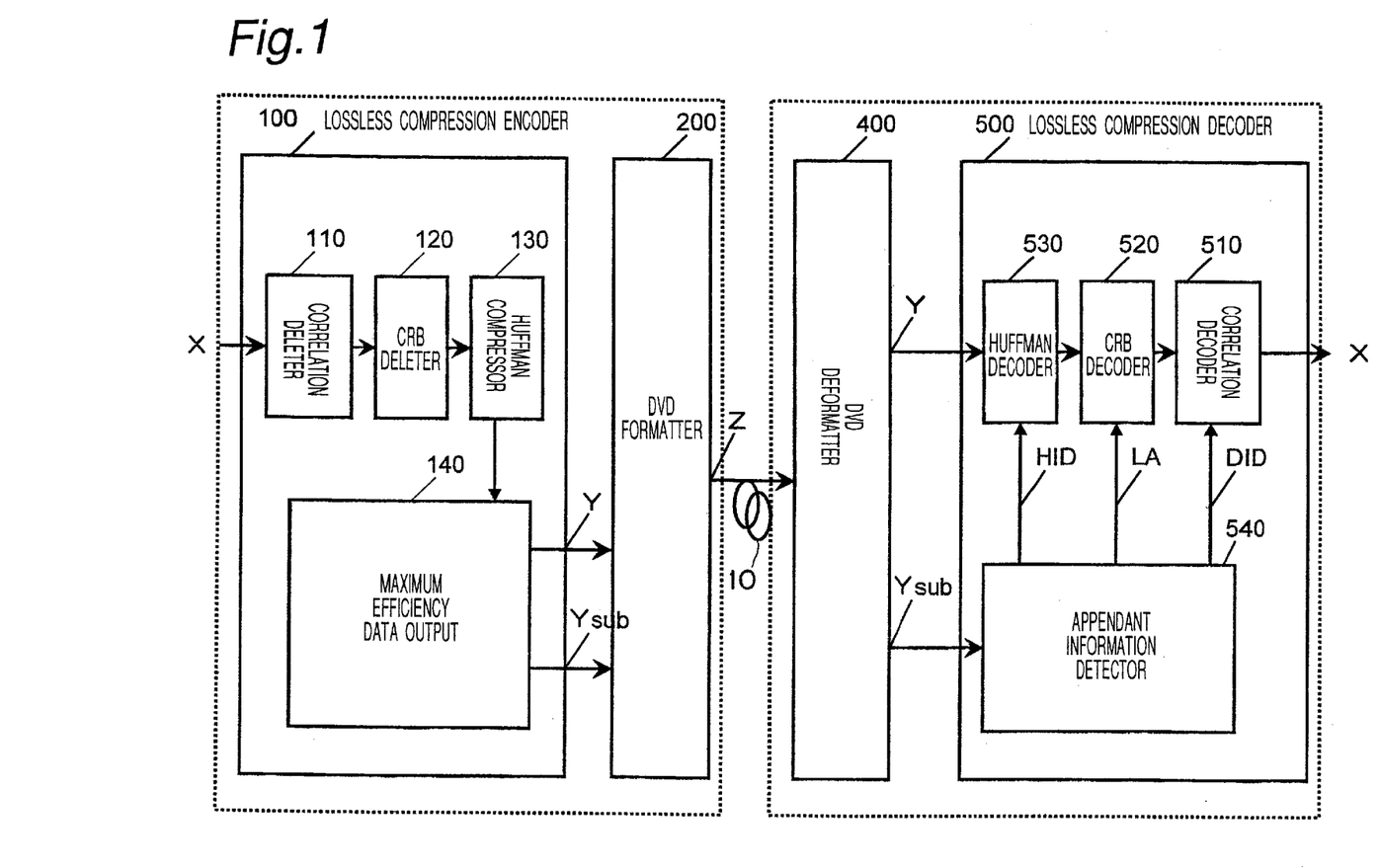
FIG. 1 is a block diagram of a method and an apparatus for lossless compression encoding and decoding of data according to the present invention.

FIG. 1 is a block diagram of the apparatuses for lossless compression encoding and decoding of data according to the invention. The lossless compression encoding apparatus comprises a lossless compression encoder 100 for lossless compression encoding and a DVD formatter 200 which converts compressed signals to DVD format signals to record the output Z thereof in a medium. The lossless compression encoder 100 comprises a correlation deleter 110, a common redundant bits (CRB) deleter 120, a Huffman compressor 130, and a maximum efficiency data outputting device 140. The lossless compression encoder 100 outputs main data as output Y and its associate data as output Ysub. The DVD formatter 200 transmits the output signal Z in the DVD format for recording. The lossless compression decoding apparatus comprises a DVD deformatter 400 for decoding and a lossless compression deciding means 500 for getting the DVD format signals from the playback signals. The DVD deformatter 400 extracts the main data Y and the associate data Ysub. The lossless compression decoder 500 comprises a Huffman decoder 530, a common redundant bits (CRB) adder (or a CRB decoder) 520, a correlation decoder 510, and an associate data detector 540. The associate data detector 540 distributes the parameter Ysub associated with the main data Y to the other components. Common redundancy bit is referred to as CRB hereinafter.

The above-mentioned components of the apparatus will now be explained in the order of the flow of the signals. As shown in FIG. 1, the correlation deleter 110 receives input signals X. The input signals X carries data in 96 kHz/24 bits/6 ch format. Though not shown in FIG. 1, a blocking device 1100 is provided at an input stage for grouping a given number of input signals X in a predetermined length of time into blocks, each block having 2880 samples (refer to FIG. 2). The following steps are carried out for each block.

Figure 2:
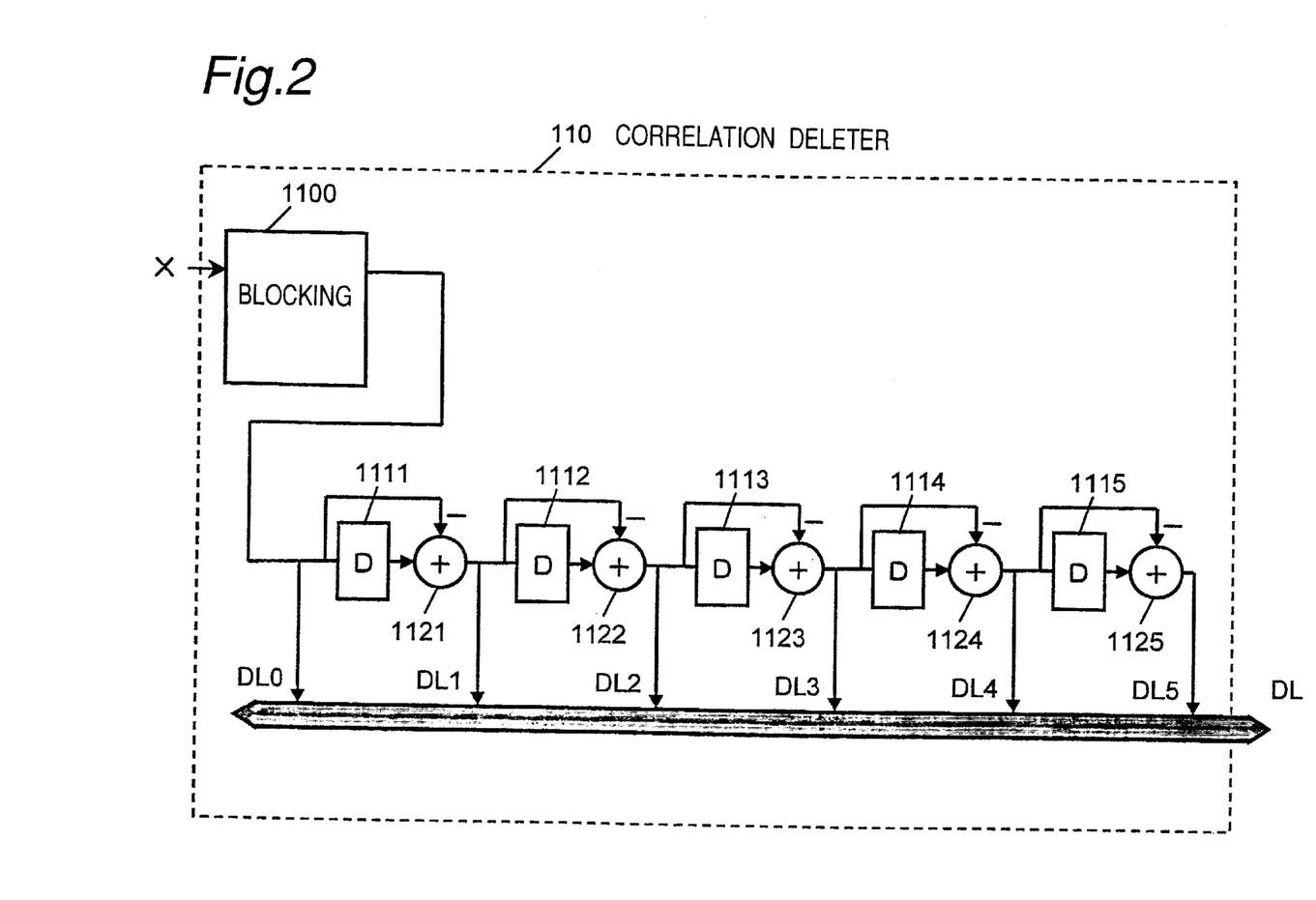
FIG. 2 is a block diagram of a correlation deleter.

The correlation deleter 110 normalizes intrinsic properties of the input signals X, bias in the frequency spectrum which occurs when two adjacent samples are high correlated and/or other properties. It is assumed that the above-mentioned correlation between samples includes correlation between channels. The properties to be examined may include a frequency spectrum characteristic and similarity of waveforms between channels. The normalization of the properties is implemented by using a frequency band filter and an inter-channel cross filter. For simplicity, preferably the filter has a range of integers identical to that of the input signals.

FIG. 2 illustrates the correlation deleter 110 in detail. The correlation deleter 110 outputs first to fifth order differential values as predictive differences. More specifically, five circuits is provided to delete correlation. Each circuit comprises a pair of a delay device 1121 to 1125 and a subtracter 1111 to 1115, and the five circuits are connected one another as a predictor to have five stages, where the output of the blocking device 1100 is calculated to provide the first to fifth order differential values DL1 to DL5 (predictive errors). A delay device may be implemented as predictive filter. The output DL0 of the blocking device 1100 is a zeroth order signal.

All of the differential values DL1 to DL5 all are transmitted to the following step, and the highest in the compressing efficiency is selected in order to delete the correlation in the most optimum way. In the encoding, the compression efficiency is calculated for all the combinations. While the encoding and decoding is carried out at the accuracy of integer level, the reversibility of data can be conserved by taking care of overflow. Accordingly, the lossless compression can be ensured completely. At the calculation at the accuracy of real number level, a re-quantizer may be added for providing the similar advantage. Thus, the correlation in the signals can successfully be deleted, while conserving the reversibility. As a result, the signal output of the correlation deleter 110 has a spectrum profile where the amplitude of waveform is decreased similarly to that of white noises.

Figure 3:
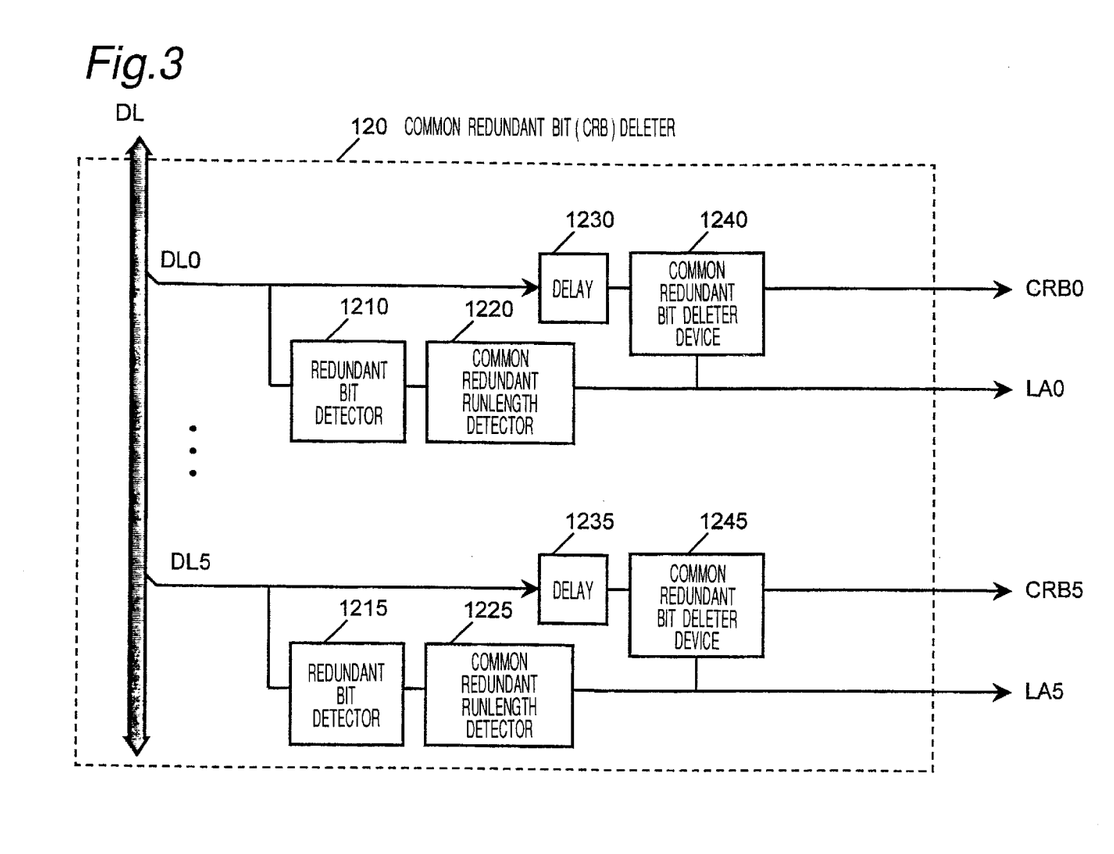
FIG. 3 is a block diagram of a common redundant bits (CRB) deleter.

The processing of zeroth-order differential signal DL0 is now explained. The signal DL0 from which correlation is deleted by the correlation deleter 110 is transmitted to the common redundant bits deleter 120. FIG. 3 is a block diagram of the common redundant bits (CRB) deleter 120. The common redundant bits deleter 120 detects redundancy of upper bits in each block or namely run lengths in sample data where 0s or 1s of upper bits exist continuously. Assuming that actual music signals in the 96 kHz/24 bits/6 ch format has average run length of 10 bits, the run length LA0 common to the samples is detected by the common redundant run length detector 1220. Meanwhile, the main data is delayed by a delay device 1230 to adjust timing for the processing of data in the block. By using the run length LA0 detected by the common redundant run length detector 1220, a common redundant bits deleter 1240 deletes common redundant bits from the main data. The original word length of 24 bits is reduced to 60% on the average. The compressed signals are then sent as CRB0, while the common redundant run length LA0 is sent as a parameter. The signals DL1 to DL5 are also processed independently in the same way. The compressed signals are sent to the Huffman compressor 130. The above-mentioned processing for run length may be implemented, similarly to a known run-length encoding technique.

Figure 4:
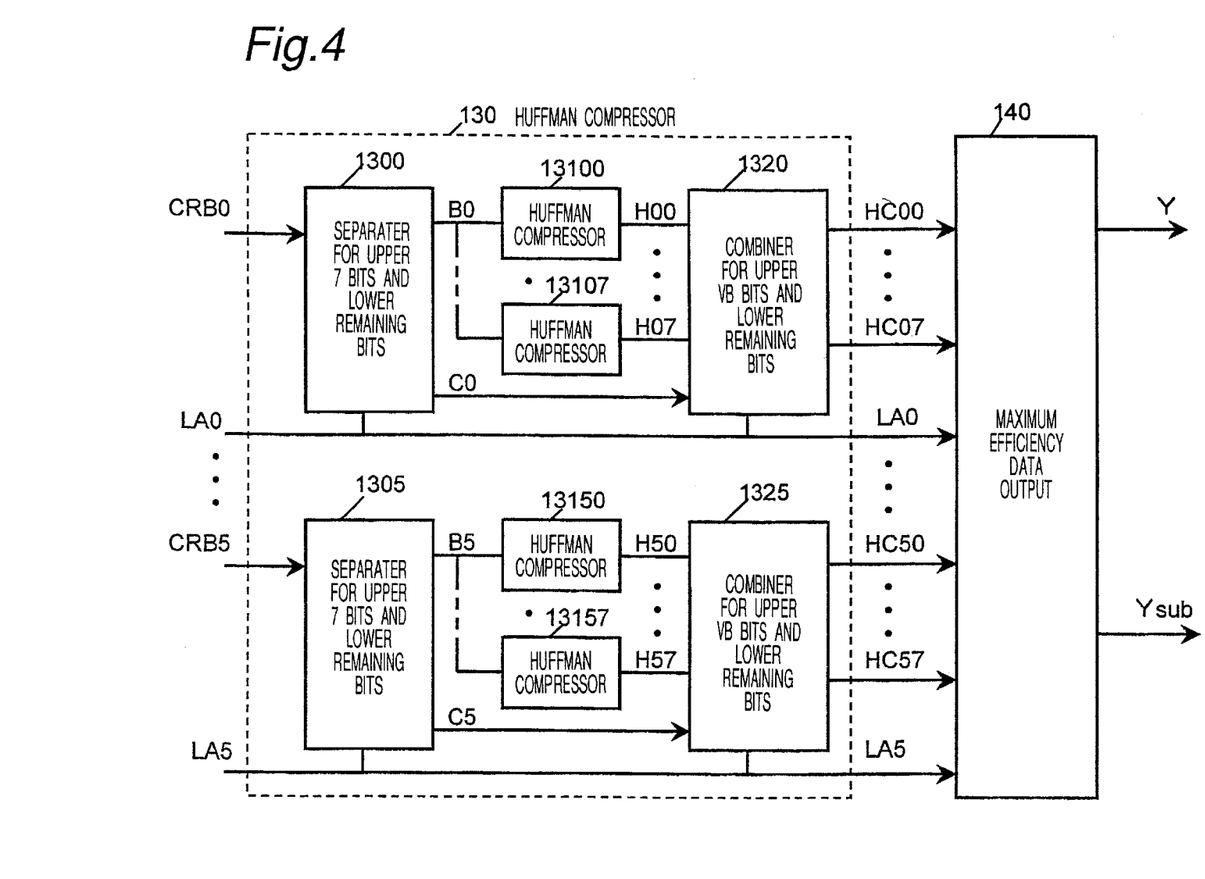
FIG. 4 is a block diagram of a Huffman compressor and a maximum efficiency data output device.

FIG. 4 is a block diagram of the Huffman compressor 130. In the Huffman compressor 130, the input signals are separated by a separator 1300 into, for example, an upper half B0 of seven bits and a lower half C0 of the remaining bits. This is carried out to make the Huffman conversion faster and to simplify the algorithm therefor. The upper half B0 of seven bits is subjected to variable length encoding by using eight different types of the Huffman conversion tables. By using a property that the histogram itself of the data is biased, a group of Huffman compressors 13100 to 13107 assign code words of short patterns to higher frequency data and code words of longer patterns to lower frequency data and sends them as H00. The remaining half of lower bits in the data is not processed and combined with each of H00 to H07 by a combining device 1320, which in turn sends a group of outputs HC00 to HC07. The other compressed data CRB1 to CRB5 are processed in the same way. Accordingly, 48 (8×6) types of compressed data are attained, from the first group of HC00 to HC07 to the sixth group of HC50 to HC57. These are sent to the maximum efficiency data output device 140. As described above, an upper portion of bits in the block after the correlation deleting is subjected to the conversion of the Huffman compressor, while the lower portion of the other bits is directly provided. This allows the Huffman conversion process to be processed in a predetermined or simplified way, thus decreasing the number of branching processings, to contribute to the speeding up of the operation.

The maximum efficiency data output device 140 selects a combination of the samples at the maximum efficiency, or a combination of minimum sum in the block and sends it as output Y. Simultaneously, the parameter of the combination is sent as associate data Ysub. The associate data may include the lower bit portion C, correlation filter parameter DID, the common redundant run length LA, and Huffman table identification parameter HID. The DVD formatter 200 then converts the main and associate data to a DVD format signal to be outputted as recording signal Z. The recording signal Z is transmitted and recorded in a DVD medium. As the highest in the efficiency is detected in the correlation deletion characteristics and selected, the compression efficiency will be increased. Further, as any optimum parameter is assigned for the correlation characteristic, the compression will be carried out in a wider level.

The method and apparatus for decoding are now explained. The DVD de-formatter 400 receives the recording signal Z reproduced from a DVD medium and gets the main data Y and its associate data Ysub from the signal Z before sending them to the lossless compression decoder 500.

Figure 5:
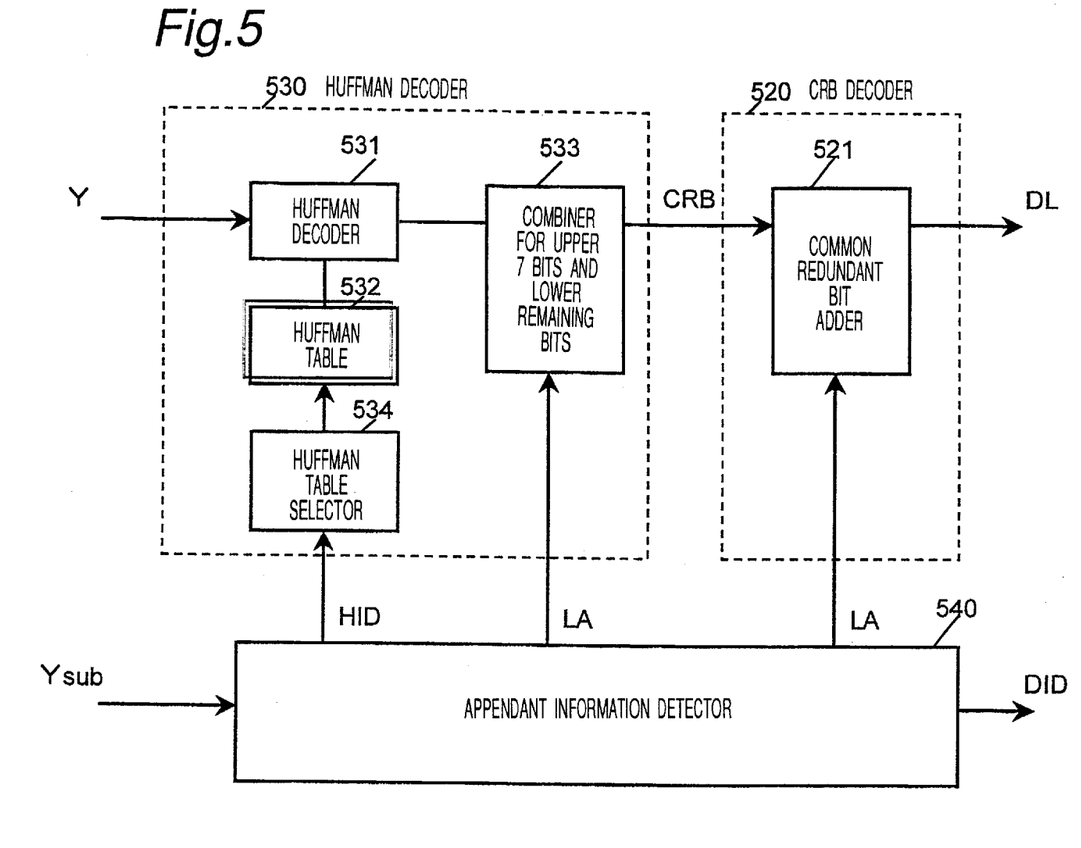
FIG. 5 is a block diagram of a Huffman decoder, a CRB decoder, and an associate data detector.

FIG. 5 is a block diagram of the Huffman decoder 530, the common redundant bits adder 521 (equivalent to the CRB decoder 520) and the associate data detector 540 in the lossless compression encoder 500. The main data Y and its associate data Ysub are sent from the DVD de-formatter 400 to the Huffman decoder 530 and the associate data detector 540 respectively. The associate data detector 540 gets the lower bits C, the common redundant run length LA, the Huffman table identification parameter HID and the like for decoding. The Huffman decoder 530 upon receiving the Huffman table identification parameter HID from the associate data detector 540 selects one Huffman table 532 out of eight tables of different types by means of Huffman table selecter. The selected Huffman table 532 is used for the decoding of a Huffman decoder 531. Because the input data has been subjected to variable length encoding, the data is decoded sequentially from the first bit, and a resultant decoded data is then combined directly with its corresponding remaining bit data C0. The word length of C0 is identical to a number of bits calculated by subtracting bits of the common redundant run length LA and seven bits from the original length of 24 bits. As described above, the Huffman decoding and the addition of the remaining bit data C0 are carried out alternately. The addition is conducted by a combining device 533 which then sends the combined data CRB of the upper half of seven bits and the lower half C0 of the other bits. In other words, the Huffman decoder 530 decodes the upper part of data which corresponds to a desired conversion pattern while the lower part containing a number of bits determined by the data transmitted in the form of a parameter in each block. As the highest in the efficiency of the Huffman compression properties is detected and selected, the compression efficiency will be increased. Further, such flexibility that the best of the Huffman tables can be selected in a wide range of amplitude from silence to the climax will be provided.

The CRB decoder 520 includes a common redundant bits adder 521 which generates and adds redundant bits to the CRB data by using the common redundant run length LA. A resultant sum data is sent as DL by the CRB decoder 520. The data DL is then transmitted to the correlation decoder 510.

Figure 6:
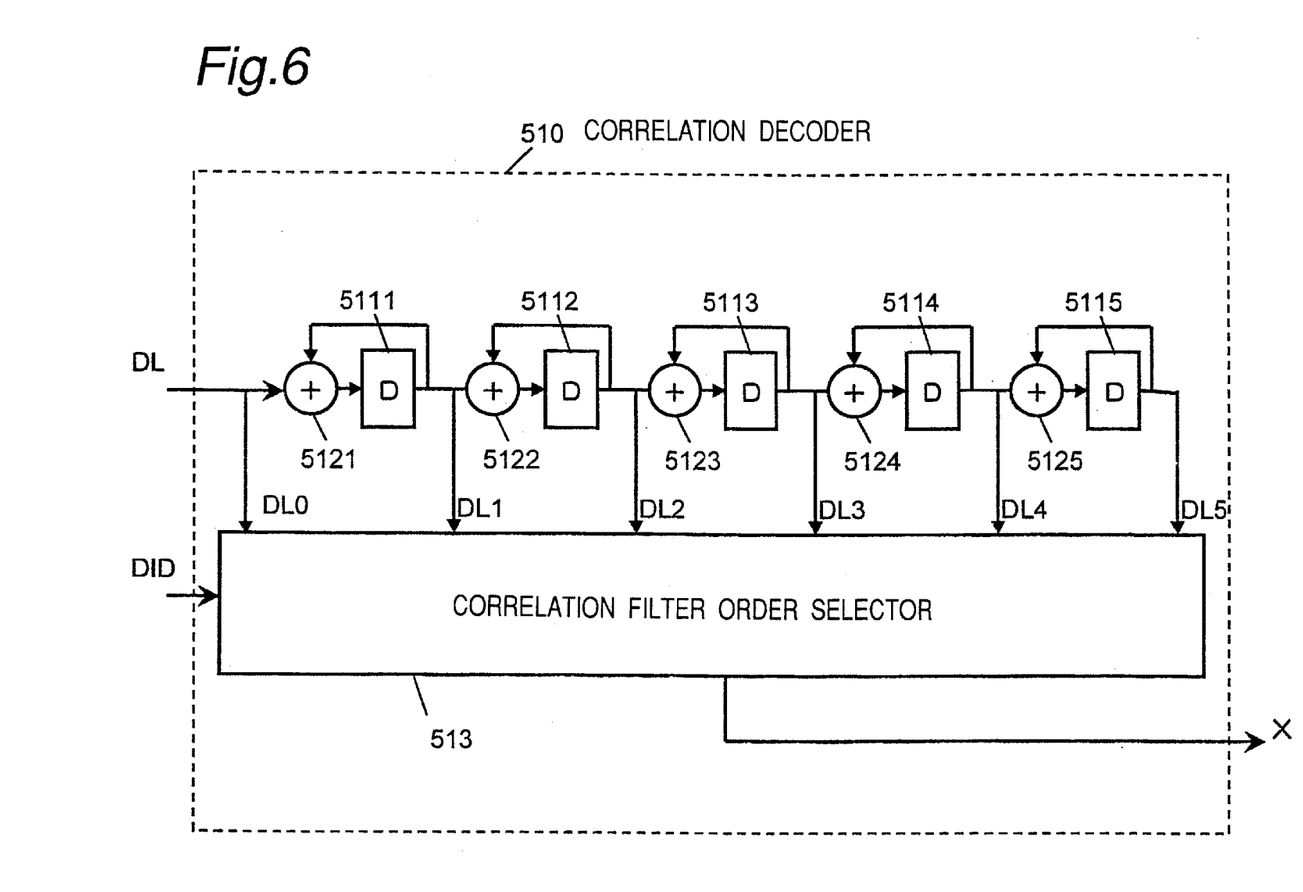
FIG. 6 is a block diagram of a correlation decoder.

FIG. 6 is a block diagram of the correlation decoder 510 where the correlation decoding is carried out by using the correlation filter parameter DID received from the associate data detector 540. The correlation decoding is reverse of the operation of the correlation deleter 110. The correlation decoder 510 provides a sum of the predictive data produced by a local predictor or a local predictive filter and the received data. While the correlation deleter 110 generates a difference, the correlation decoder 510 handles a sum. The order number is determined from the correlation filter parameter DID, and a selector 513 of correlation filter order number selects and outputs it. The output X of the selector 513 is a playback signal in 96 kHz/24 bits format. The local predictor or the local predictive filter may perform integer calculation at accuracy equal to that of the playback signals. Those processings are explained above on channel 1, but the similar procedure is repeated for the other channels. As a result, signals in the 96 kHz/24 bits/6 ch format can be reproduced.

As described above, the foregoing procedure is performed for each block. The block extends in a time length of about 15 ms. The top five samples in the block are not converted but transmitted as linear PCM signals. In that case, five samples are not subjected to the common redundant bits deletion and the Huffman conversion, so that the advantage of the common redundant bits deletion cannot be canceled by the five samples. Because the samples at the top of the block remain as linear PCM signals, each block data are initialized, the accumulation of errors is reset, and the returning speed from error propagation can be made faster. Accordingly, the error propagation will be avoided, and the sound can correctly be reproduced in specific playback operations such as cue/review, and the playback sound can be heard with ease.

As described above, each operation is performed at the accuracy of integer level. Further, in case of overflow or underflow, the combination with the parameter is not used. Because the decoding is reverse of the encoding, the entropy in the input signals can precisely be conserved, and more particularly, the lossless compression encoding and decoding can successfully be made without degradation. With use of Huffman conversion tables and the like, the data of 96 kHz/24 bits/6 ch at source rate of 13.824 Mbps, for example, can be compressed at a ratio of 0.54. Then, the bit rate of compressed data is 7.465 Mbps. The bit rate of 7.465 Mbps is far lower than 9.6 Mbps of the maximum rate of the DVD format and is yet smaller than 8.47 Mbps required for allowing a playback time of 74 minutes. As the target of the compression rate is set not, greater than 60%, it can be achieved by comfortable margin of 10%.

The method can be utilized not only in the above-mentioned apparatus but also by implementing a software program with a digital signal processor (DSP) for processing the data. The software program may be transmitted over a communication network.

Figure 7:
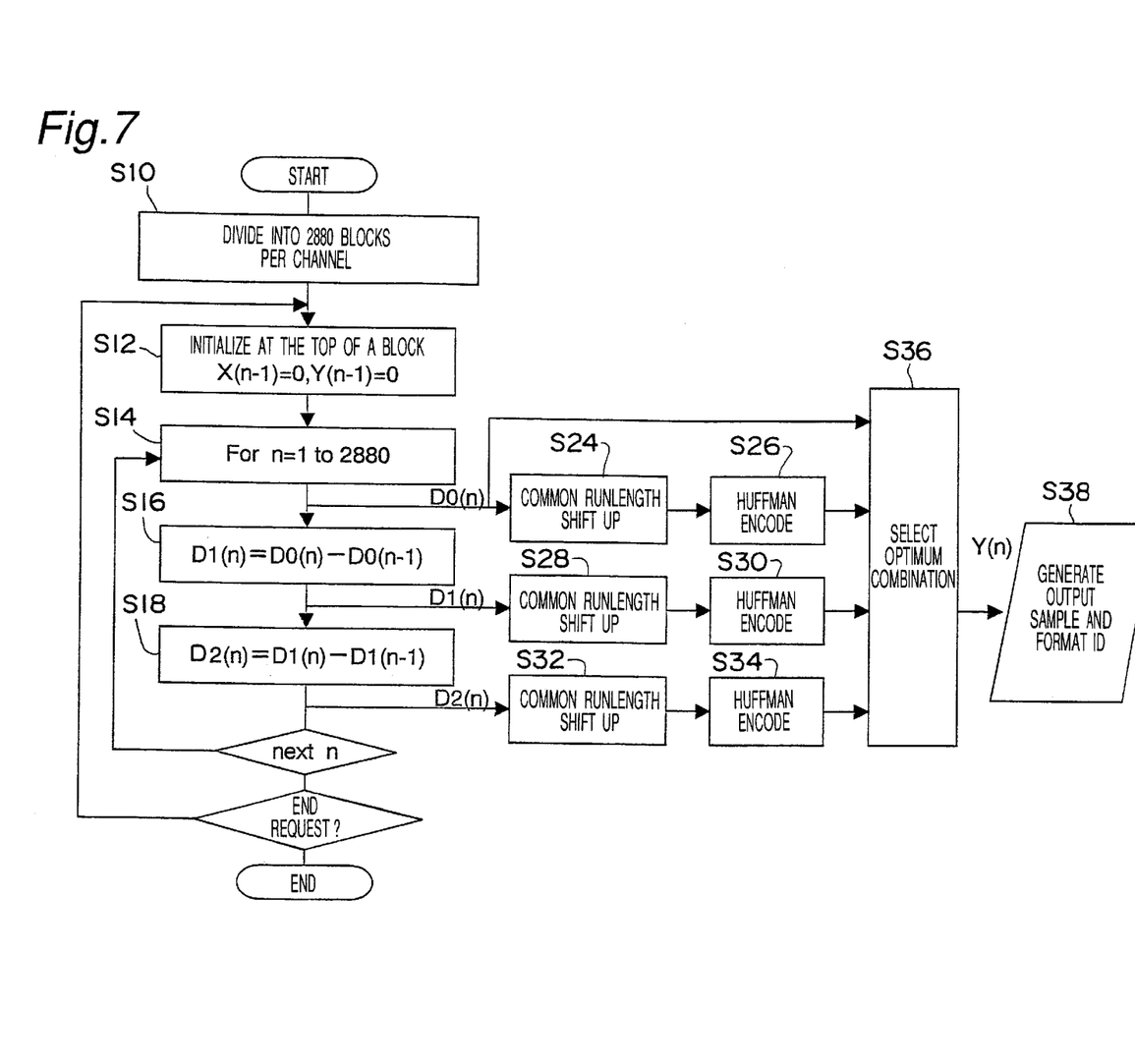
FIG. 7 is a flowchart of an algorithm of lossless compression encoding.

FIG. 7 is a flowchart of a procedure of a software program for lossless compression encoding. The procedure starts with grouping the data of input signals to 2880 blocks per channel (S10). Next, as to the signals in a block, data at the top in the block is initialized (S12). That is, X(n−1)=0, and Y(n−1)=0. Next, as to data in the n-th block, zeroth order output L0(n) is calculated in n-th block (S14). Further, a first order differential value D1(n) and a second order differential value D2(n) are calculated and outputted (S16 and S18). In other words, D1(n)=D0(n)−D0(n), and D2(n)=D1(n)−D1(n). Then, n is incremented (S20). For lossless compression encoding, the zero to second order differential values D0(n), D1(n), and D2(n) are subjected to the common run length shift-up (S24, S28, and S32) and the Huffman encoding (at S26, S30, and S34). An optimum combination of the data is selected for ensuring the maximum compression efficiency, and the selected signal Y(n) is outputted (S36). This procedure is similar to the lossless compression encoding in the compression encoding apparatus shown in FIG. 1. Next, an output sample and a format ID in the DVD format are generated from the signal Y(n) (at S38). The value of n is 1 at the start, and the steps are repeated until n becomes 2880. When all the data in the block have been processed and the processing of all the blocks is not finished, the flow returns back to step S12 (S22) for processing the data in a next block. A software program for the lossless compression decoding is similar, and its explanation is not repeated here.

Figure 8:
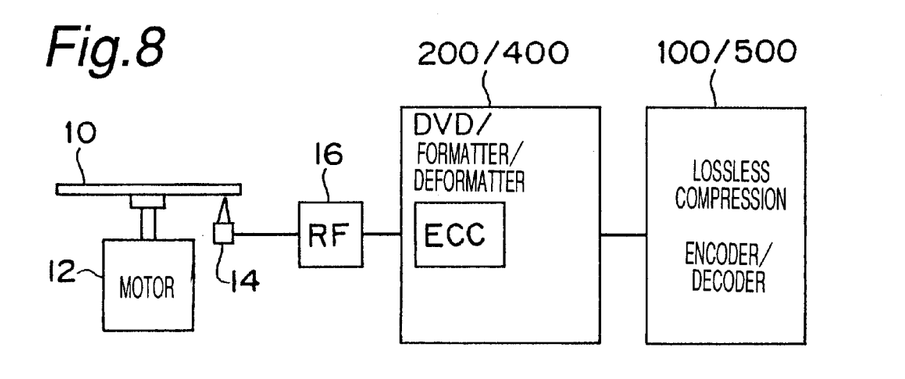
FIG. 8 is a block diagram of a record/playback apparatus equipped with a lossless compression encoder/decoder.

FIG. 8 is a block diagram of a record/playback apparatus equipped with the above-mentioned lossless compression encoding and decoding apparatuses. The record/playback apparatus has a known structure, except the lossless compression encoder and decoder 100 and 500. An optical disk 10 is driven for rotation by a spindle motor 12. In the record/playback operation, an optical head 14 directs a laser beam to the optical disk or medium 10 for recording data and for reproducing the data as playback signals based on reflection of the laser beam from the optical disk 10. In the playback mode, the playback signals are converted to digital data by an RF signal circuit 16 and sent to an error correction circuit (ECC) in the DVD de-formatter 400. The signals are then decoded by the above-mentioned operation of the lossless compression decoder 500. In the record mode, signals are encoded by the lossless compression encoder/decoder 100 and sent via an ECC circuit in the DVD formatter 200 to the RF signal circuit 16 where they are converted to analog signals.

As set forth above, the method and apparatus for lossless compression encoding according to the invention detects correlation in the input signals with the correlation deleter for normalization, deletes a signal redundancy with the CRB deleter and compresses the remaining data of the signals with the Huffman compression processing means by using bias in the data profile. The method and apparatus for lossless compression decoding according to the invention decodes the compressed data in reverse sequence with the Huffman decoder, the CRB decoder, and the correlation decoder so that the input signals of a wide-band multi-channel format of audio data can be received and played without degradation. As the data of the input signal is compressed to a size substantially equal to the entropy of the input signal, the number of modes employed for the DVD audio format can be increased. Also, the playback time of DVD audio data will significantly be extended. Since a large amount of data of the super-audio technology are compressed to a desired size without degradation, the data of a 96 kHz/24 bits/6 ch source format can be stored in a DVD audio medium, allowing a higher quality and a longer playback period.

What is claimed is:

1. A method of lossless compression encoding comprising the steps of:

grouping a given number of input data samples in a predetermined length of time to blocks;

deleting correlation between the samples in each block;

determining redundant run lengths in the data after subjected to the correlation deletion step;

detecting a minimum of the redundant run length or a run length redundant portion common in the samples and deleting the common redundant portion from each sample;

subjecting the data subjected to the step for deleting the common redundant portion to the Huffman conversion; and providing the run length data of the common redundant portion and the Huffman-converted data for each sample.

2. The method of lossless compression encoding according to claim 1, wherein the step of deleting correlation includes the step of getting a difference, or a predictive difference, between the data predicted by a predictor or a predictive filter and the real data.

3. The method of lossless compression encoding according to claim 2, wherein the predictor or the predictive filter comprises a circuit for integer calculation having accuracy equal to a range of integers of the input data.

4. The method of lossless compression encoding according to claim 1, wherein the step of Huffman conversion comprises the steps of:

separating the data deleting the common redundant portion to an upper part having a predetermined number of bits and a lower part of the other bits, and subjecting only the upper part to the Huffman conversion.

5. The method of lossless compression encoding according to claim 1, wherein a plurality of correlation deleters are used to delete correlation, and output data of each of the correlation deleters are subjected to the deletion of the common redundant portion, each data after the deletion of the common redundant portion is subjected to the Huffman conversion, a combination having the maximum efficiency is selected among the data subjected to the Huffman conversion, and a parameter indicative of the combination is transmitted.

6. The method of lossless compression encoding according to claim 1, wherein the Huffman conversion is performed by selecting and using one of conversion algorithms which provides the maximum efficiency for the block, and a parameter indicative of the algorithm is transmitted.

7. The method of lossless compression encoding according to claim 1, wherein the sample data at a particular position in the top of a block are linear pulse code modulation data, and the redundant run length is determined at positions other than the particular position.

8. An apparatus for lossless compression encoding comprising:

a framing device that groups a given number of input data samples in a predetermined length of time to blocks;

a correlation deleter which deletes correlation between the samples in each block;

a common redundant bits deleter which determines redundant run length in the data after the correlation is deleted, detects a minimum of the redundant run length or run length of common redundant portion in the samples, and deletes the common redundant portion from each sample; and a Huffman conversion device which subjects the data after deleting the common redundant portion to the Huffman conversion;

whereby the run length data of the common redundant portion and the Huffman-converted data in each sample are provided.

9. The apparatus for lossless compression encoding according to claim 8, wherein the correlation deleter outputs a difference or a predictive difference between the predictive data generated by a predictor or a predictive filter and the real data.

10. The apparatus for lossless compression encoding according to claim 9, wherein the predictor or the predictive filter comprises a circuit for integer calculation having an accuracy equal to that of a range of integers of the input data.

11. The apparatus for lossless compression encoding according to claim 8, wherein the Huffman conversion device separates the data after deleting the common redundant portion by the common redundant bits deleter to an upper part having a predetermined number of bits and a lower part of the other bits and subjecting only the upper part to the Huffman conversion.

12. The apparatus for lossless compression encoding according to claim 8, wherein the Huffman conversion device selects one of conversion algorithms which provides the maximum efficiency for the block, uses it for the conversion and transmits a parameter indicative of the algorithm.

13. The apparatus for lossless compression encoding according to claim 8, comprising a plurality of sets of the correlation deleter, the common redundant bits deleter and the Huffman conversion device, further comprising a maximum efficiency data output device which Huffman conversion device, further comprising a maximum efficiency data output device which selects and outputs data which provide the maximum efficiency from the output data of the plurality of the Huffman conversion devices, the maximum efficiency data output device outputs a combination of the data which provides the maximum efficiency and transmits a parameter indicative of the combination.

14. The apparatus for lossless compression encoding according to claim 8, wherein the sample data at the particular position at the top in each block are linear pulse code modulation data, and the common redundant bits deleter calculates the redundant run length in other positions than the particular position.

15. A method of lossless compression decoding comprising the steps of:

receiving code data comprising run length data of a common redundant portion and data subjected to Huffman conversion in each sample, the data having been obtained by grouping a given number of input data samples in a predetermined length of time into blocks, by deleting correlation between the samples in each block, by determining a redundant run length or a run length of a common redundant portion in the samples after the correlation deletion, and by deleting the redundant run length from each sample;

getting a conversion algorithm from the input data to use it for the Huffman decoding;

getting the run length data of the common redundant portion and adding it to decoded data after the Huffman decoding; and performing correlation decoding on the data to which the redundant portion is added.

16. The method of lossless compression decoding according to claim 15, wherein in the step of correlation decoding, a sum of a predictive data generated by a local predictor or a local predictive filter and the transmitted input data is obtained.

17. The method of lossless compression decoding according to claim 16, wherein the local predictor or the local predictive filter comprises a circuit for integer calculation operated at accuracy equal to that of a range of integers of playback data.

18. The method of lossless compression decoding according to claim 17, wherein in the step of Huffman decoding, the input data are separated into an upper part in correspondence to a given pattern of the Huffman conversion and a lower part having a predetermined number of bits determined by the data transmitted as a parameter for each block and only the upper part is subjected to the Huffman decoding.

19. The method of lossless compression decoding according to claim 15, wherein in the step of correlation decoding, signals having a predetermined characteristic are selected according to the data transmitted as a parameter for each block.

20. The method of lossless compression decoding according to claim 15, wherein in the step of Huffman decoding, signals having the predetermined characteristic are selected according to data transmitted as a parameter for each block.

21. The method of lossless compression decoding according to one of claim 15, wherein the sample data at a particular position in the top of each block are linear PCM data, and internal calculation for the correlation decoding is initialized by using the linear PCM data.

22. An apparatus for lossless compression decoding which receives code data comprising run length data of a common redundant portion and data subjected to Huffman conversion in each sample, the code data being obtained by grouping a given number of input data samples in a predetermined length of time into blocks, by deleting correlation between the samples in each block, by determining redundant run length or run length of the common redundant portion in the samples after the correlation deletion, and by deleting the redundant run length from each sample, the apparatus comprising:

a Huffman decoder which gets a parameter indicative of a conversion algorithm from the received data and perform the Huffman decoding;

a common redundant bit deleter which gets the run length data of the common redundant portion and adds it to the decoded data which have been subjected to the Huffman decoding; and a correlation decoder which performs correlation decoding on the data received from the common redundant bit deleter.

23. The apparatus for lossless compression decoding according to claim 22, wherein the correlation decoder calculates a sum of a predictive data produced by a local predictor or a local predictive filter and the received data.

24. The apparatus for lossless compression decoding according to claim 23, wherein the local predictor or the local predictive filter is a circuit for integer calculation operated at accuracy equal to that of a range of integers of the playback data.

25. The apparatus for lossless compression decoding according to claim 24, wherein the Huffman decoder which gets a parameter indicative of the conversion algorithm from the received data separates the data to an upper part corresponding to a given pattern of the conversion and a lower parts having a number of bits determined by a parameter in the data transmitted for each block, and only the upper part is subjected to the Huffman decoding.

26. The apparatus for lossless compression decoding according to claim 22, wherein the Huffman decoder selects a signal having a property determined by the data transmitted for each block.

27. The apparatus for lossless compression decoding according to claim 22, further comprising an associate data detector which detects data associated with the received coded data, wherein the Huffman decoder includes a plurality of Huffman tables and the associate data detector selects one of the Huffman tables corresponding to the associate data.

28. The apparatus for lossless compression decoding according to claim 22, wherein the Huffman decoder selects a signal of the properties determined by the data transmitted as a parameter for each block.

29. The apparatus for lossless compression decoding according to claim 22, wherein the sample data positioned at a particular position in the top of each block are linear pulse code modulation data and the correlation decoder initializes internal operation for the correlation decoding by using the linear pulse code modulation data.

30. A recording apparatus comprising:
  a lossless compression encoder defined in claim 8 which compresses input signals;
  a DVD formatter which converts signals received from the lossless compression encoder to DVD format signals;
  an RF circuit for converting the DVD format signals received from the DVD formatter to RF signals; and
  an optical head which records data of the RF signals received from the RF circuit in an optical disk.

31. A playback apparatus comprising: an optical head which reproduces data from an optical disk;
  an RF circuit which converts the data received from the optical head to digital input signals;
  a DVD de-formatter which converts the signals received from the RF circuit to code data; and
  a lossless compression decoder defined in claim 22 which decodes the code data received from the DVD de-formatter.

* * * * *